United States Patent
Li et al.

(10) Patent No.: US 9,711,759 B2
(45) Date of Patent: Jul. 18, 2017

(54) ORGANIC LIGHT EMITTING DIODE DISPLAY

(71) Applicant: Innolux Corporation, Chu-Nan (TW)

(72) Inventors: Chun-Kai Li, Chu-Nan (TW); Hsin-Hui Wu, Chu-Nan (TW)

(73) Assignee: INNOLUX CORPORATION, Chu-Nan (TW)

( * ) Notice: Subject to any disclaimer, the term of this patent is extended or adjusted under 35 U.S.C. 154(b) by 94 days.

(21) Appl. No.: 14/704,687

(22) Filed: May 5, 2015

(65) Prior Publication Data

US 2015/0357602 A1    Dec. 10, 2015

(30) Foreign Application Priority Data

Jun. 4, 2014    (TW) .............................. 103119346 A (51) Int. Cl.
| | |
|---|---|
| *H01L 51/52* | (2006.01) |
| *H01L 51/50* | (2006.01) |
| *H01L 27/32* | (2006.01) |
| *H01L 51/00* | (2006.01) |

(52) U.S. Cl.
CPC ...... *H01L 51/5284* (2013.01); *H01L 27/3246* (2013.01); *H01L 51/008* (2013.01); *H01L 51/0053* (2013.01); *H01L 51/0092* (2013.01)

(58) Field of Classification Search
CPC ......... H01L 51/52; H01L 51/50; H01L 27/32; H01L 51/5284; H01L 27/3246; H01L 51/5012; H01L 2251/558
USPC .......................................................... 257/40
See application file for complete search history.

(56) References Cited

U.S. PATENT DOCUMENTS

| | | | |
|---|---|---|---|
| 7,215,073 B2 | 5/2007 | Yeh et al. | |
| 9,153,627 B2* | 10/2015 | Ohsawa | ............... H01L 27/3206 |
| 2003/0214691 A1* | 11/2003 | Magno | ................ H01L 27/3211 |
| | | | 313/498 |

(Continued)

FOREIGN PATENT DOCUMENTS

| | | |
|---|---|---|
| CN | 101257746 A | 9/2008 |
| CN | 102189857 A | 9/2011 |
| CN | 101581883 | 6/2013 |
| CN | 203085550 U | 7/2013 |
| CN | 103474450 A | 12/2013 |

OTHER PUBLICATIONS

Taiwanese Office Action issued on Jan. 20, 2016.
Chinese Office Action dated Sep. 20, 2016.

*Primary Examiner* — Alexander Oscar Williams
(74) *Attorney, Agent, or Firm* — Rabin & Berdo, P.C.

(57) ABSTRACT

An organic light emitting diode (OLED) display is provided. The OLED display has a plurality of pixel regions and comprises a substrate, a first electrode layer formed on the substrate, a second electrode layer formed on the first electrode layer, a pixel defining layer, and a light absorption composite layer. The pixel regions are separated by the pixel defining layer. The light absorption composite layer is formed on the substrate, and absorbs a light with wavelength of 380~780 nm. The light absorption composite layer comprises a first light absorption layer and a second light absorption layer stacked together. The first light absorption layer absorbs a light with shorter wavelength. The second light absorption layer absorbs a light with longer wavelength different from that of the light absorbed by the first light absorption layer in the region of 380~780 nm.

13 Claims, 4 Drawing Sheets

(56) References Cited

U.S. PATENT DOCUMENTS

| | | | |
|---|---|---|---|
| 2005/0231103 A1* | 10/2005 | Kim | H01L 51/5253 313/504 |
| 2009/0015750 A1* | 1/2009 | Crossland | G02F 1/1347 349/62 |
| 2010/0051929 A1 | 3/2010 | Choi | |
| 2010/0051973 A1* | 3/2010 | Kobayashi | H01L 51/5092 257/88 |
| 2010/0065862 A1* | 3/2010 | Ray | B82Y 20/00 257/88 |
| 2010/0167441 A1* | 7/2010 | Ray | G09G 3/32 438/29 |
| 2015/0014655 A1* | 1/2015 | Yun | H01L 27/322 257/40 |
| 2015/0014658 A1* | 1/2015 | Choung | H01L 51/5203 257/40 |
| 2015/0303242 A1* | 10/2015 | Dai | H01L 51/56 257/40 |
| 2015/0349040 A1* | 12/2015 | Park | H01L 27/322 257/40 |
| 2016/0049443 A1* | 2/2016 | Kim | H01L 51/0023 257/91 |
| 2016/0126499 A1* | 5/2016 | Dai | H01L 27/3211 257/40 |
| 2016/0195760 A1* | 7/2016 | Cho | G02F 1/133606 362/19 |
| 2016/0285049 A1* | 9/2016 | Song | H01L 51/5275 |
| 2016/0285053 A1* | 9/2016 | Rohatgi | H01L 51/56 |

\* cited by examiner

ORGANIC LIGHT EMITTING DIODE DISPLAY

This application claims the benefit of Taiwan application Serial No. 103119346, filed Jun. 4, 2014, the subject matter of which is incorporated herein by reference.

BACKGROUND OF THE INVENTION

Field of the Invention

The disclosure relates in general to an organic light emitting diode (OLED) display, and more particularly to an OLED display well repressing side light-leakage.

Description of the Related Art

Organic light emitting diode (OLED) display has many advantages such as thinness, active light, requiring no backlight source and having no view angle restriction. In response to consumers' expectation of high display quality of electronic products, the image resolution of the OLED display must be directed towards high pixel per inch (PPI).

However, during the process of manufacturing light emitting elements of the OLED display, due to the variations in process conditions, the display may have non-uniform or abnormal display colors, side light-leakage, or color cast. Therefore, how to provide an OLED display having high resolution and high display quality has become a prominent task for the industries.

SUMMARY OF THE INVENTION

The disclosure is directed to an organic light emitting diode (OLED) display of an embodiment of the disclosure. The wavelength of the light absorbed by the light absorption composite layer composed of a first light absorption layer and a second light absorption layer effectively covers the wavelength of the visible light, such that side light-leakage between pixel regions is effectively prevented, and the color saturation and display effect of the display is greatly improved.

According to one embodiment of the disclosure, an organic light emitting diode (OLED) display is provided. The OLED display has a plurality of pixel regions and comprises a substrate, a first electrode layer, a second electrode layer, a pixel defining layer and a light absorption composite layer. The first electrode layer is formed on the substrate. The second electrode layer is formed on the first electrode layer. The pixel regions are separated by the pixel defining layer. The light absorption composite layer is formed on the substrate, and absorbs a light with wavelength of 380~780 nm. The light absorption composite layer comprises a first light absorption layer and a second light absorption layer formed on the first light absorption layer. The first light absorption layer absorbs a light with shorter wavelength and the second light absorption layer absorbs a light with longer wavelength different from that of the light absorbed by the first light absorption layer in the region of 380~780 nm.

The above and other aspects of the disclosure will become better understood with regard to the following detailed description of the preferred but non-limiting embodiment (s). The following description is made with reference to the accompanying drawings.

DETAILED DESCRIPTION OF THE INVENTION

According to the organic light emitting diode (OLED) display disclosed in an of the disclosure, the wavelength of the light absorbed by the light absorption composite layer composed of a first light absorption layer and a second light absorption layer effectively covers the wavelength of the visible light, such that side light-leakage between pixel regions is effectively prevented, and the color saturation and display effect of the display is greatly improved. Detailed descriptions of the embodiments of the disclosure are disclosed below with accompanying drawings. In the accompanying diagrams, the same numeric designations indicate the same or similar components. It should be noted that accompanying drawings are simplified so as to provide clear descriptions of the embodiments of the disclosure, and the following detailed description are exemplary and explanatory only and are not restrictive of the disclosed embodiments as claimed. Anyone who is skilled in the technology field of the disclosure can make necessary modifications or variations to the structures according to the needs in actual implementations.

Figure 1:
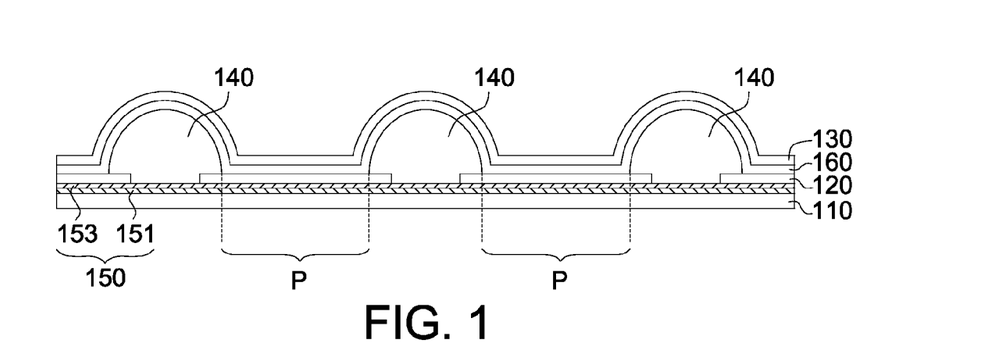
FIG. 1 is a schematic diagram of an OLED display according to an embodiment of the disclosure.

FIG. 1 is a schematic diagram of an OLED display 100 according to an embodiment of the disclosure. As indicated in FIG. 1, the OLED display 100 has a plurality of pixel regions P, and comprises a substrate 110, a first electrode layer 120, a second electrode layer 130, a pixel defining layer 140 and a light absorption composite layer 150. The first electrode layer 120 is formed on the substrate 110 and corresponds to the pixel regions P. The second electrode layer 130 is formed on the first electrode layer 120. The pixel regions P are separated by the pixel defining layer 140. The light absorption composite layer 150 is formed on the substrate 110 and at least corresponds to the pixel defining layer 140. The wavelength of the light absorbed by the light absorption composite layer 150 covers the wavelength of the visible light and comprises the region of 380~780 nm. The light absorption composite layer 150 comprises at least a first light absorption layer 151 and a second light absorption layer 153. The first light absorption layer 151 absorbs a light with first wavelength. The second light absorption layer 153 is located on the first light absorption layer 151 and absorbs a light with second wavelength. The r first wavelength is different from the second wavelength. The first wavelength and the second wavelength both cover at least partial wavelength of the visible light. The difference in the wavelengths indicates that the wavelengths of the two absorbed lights are not identical. Therefore, the wavelength of the light absorbed by the first light absorption layer and that absorbed by the second light absorption layer can be partially overlapping each other, adjacent to each other, or separated from each other.

In an embodiment, the first light absorption layer 151 has a transmittance of 20~80% of the light with the first wavelength, and the second light absorption layer 153 has a transmittance of 20~80% of the light with the second wavelength.

In an embodiment, the first light absorption layer 151 further absorbs a light with the second wavelength, and the transmittance of the first light absorption layer 151 of the light with the first wavelength is, for example, smaller than that of the light with the second wavelength.

In an embodiment, the second light absorption layer 153 further absorbs a light with the first wavelength, and the transmittance of the second light absorption layer 153 of the light with the first wavelength is, for example, greater than that of the light with the second wavelength.

In an embodiment, the first light absorption layer 151 and the second light absorption layer 153 both have a thickness of 500~4000 Å.

In an embodiment, the OLED display 100 can be realized by such as a white light OLED display, the light emitted by each pixel region P corresponds to a specific color block of a color filter, and the pixel regions P corresponding to different color blocks are separated by the pixel defining layer 140. The light absorption composite layer 150 absorbs a light with wavelength of 380~780 nm, which covers the wavelength of the visible light. Therefore, the light absorption composite layer 150 can absorb the light emitted by a pixel region P and radiated to an adjacent pixel region P, hence effectively preventing side light-leakage between the pixel regions P.

In the formation of a single-layered pixel defining layer or a patterned mask layer, normally the pattern of the pixel defining layer or the patterned mask layer is formed by using an exposure and development process in collaboration with a UV light curing process. For the UV light to cure the pixel defining layer or the patterned mask layer to form desired pattern, the material of the pixel defining layer or the patterned mask layer must allow the blue violet light to pass through. The pixel defining layer or the patterned mask layer formed by using the above process is by no means pure black, and is incapable of absorbing entire wavelength of the visible light. That is, the single-layered pixel defining layer or the patterned mask layer is incapable of absorbing or shielding the entire wavelength of the visible light (380~780 nm). At least, the blue violet light may leak out. Thus, the light between the pixel regions cannot be completely isolated, and light leakage between the pixel regions cannot be effectively prevented.

In an embodiment as indicated in FIG. 1, the first light absorption layer 151 is stacked on the second light absorption layer 153 and directly contacts the second light absorption layer 153. The first light absorption layer 151 absorbs a light with the first wavelength (covering shorter wavelength) of 380~480 nm, that is, the wavelength of the blue violet light. In other words, the second light absorption layer 153 absorbs a light with the wavelength of 480~780 nm (at least covering the second wavelength). That is, through the collaboration of the first light absorption layer 151 and the second light absorption layer 153, the wavelength of the light absorbed by the light absorption composite layer 150 effectively covers the entire wavelength of the visible light. Therefore, the light absorption composite layer 150, possessing the characteristics of pure black color, can absorb the entire wavelength of the visible light and effectively prevent side light-leakage between the pixel regions. Thus, the monocratic purity of each pixel region P and the color saturation of the display can both be increased, such that the display effect can further be improved.

The light absorption composite layer 150 composed of the first light absorption layer 151 and the second light absorption layer 153 has additive effect in light absorption, and absorbs the light better than the single-layered structure, and can better isolate light leakage between the pixel regions.

In an embodiment, at least one of the first light absorption layer 151 or the second light absorption layer 153 comprises an organic material, such as the material used in the hole transport layer, the light emitting layer and/or the electron transport layer. The first light absorption layer 151 and the second light absorption layer 153 are formed of macromolecules by using a spin coating process. The spin coating process is a wet process which generates solvents or contaminants. Conversely, in an embodiment of the disclosure, the first light absorption layer 151 and the second light absorption layer 153 are formed of a micro-molecular organic material or an evaporable macro-molecular organic material by using an evaporation process. The evaporation process is a dry process and is free of the problems caused by solvents, contaminants and moisture, such that the purity and quality of the first light absorption layer 151 and the second light absorption layer 153 can be increased. Also, the first light absorption layer 151 and the second light absorption layer 153 which are formed of an organic material by using the evaporation process both have a smaller thickness of 500~4000 Å. In an embodiment, the light absorption composite layer 150 has a thickness of 4000 Å. When the first light absorption layer 151 and the second light absorption layer 153 are used as a material for forming a hole transport layer, a light emitting layer and/or an electron transport layer, the first light absorption layer 151 and the second light absorption layer 153 must be thin enough to avoid the effect of light absorption which will jeopardize the light extraction efficiency of the light emitting elements. Therefore, the thickness is normally reduced to be less than 100 Å. In the present embodiment, the first light absorption layer 151 and the second light absorption layer 153 are used for forming the light absorption composite layer 150 because of the characteristics of light absorption of the first light absorption layer 151 and the second light absorption layer 153, therefore the first light absorption layer 151 and the second light absorption layer 153 need to have a certain thickness.

In an embodiment, at least one of the first light absorption layer 151 or the second light absorption layer 153 may comprise one of the following compounds or a combination of two or more than two thereof:

(CuPc; absorption wavelength: 600~800 nm)

(ZnPc; absorption wavelength: 600~700 nm)

(SubPc; absorption wavelength: 450~600 nm)

(SubNc; absorption wavelength: 500~750 nm)

-continued

(Perylene)

(PTCDA; absorption wavelength: 400~600 nm)

(PTCDI; absorption wavelength: 400~600 nm)

(P3HT; absorption wavelength: 400~650 nm)

(PCBM; absorption wavelength: 300~600 nm)

-continued (DCJTB; absorption wavelength: 400~650 nm)
(Fe₂O₃; absorption wavelength: 300~600 nm).

Each material has its own absorption wavelength. When the light absorption composite layer 150 is composed of the first light absorption layer 151 and the second light absorption layer 153, the material types of the first light absorption layer 151 and the second light absorption layer 153 can be suitably selected such that desired absorption wavelength can be achieved, and the light absorption composite layer 150 formed thereby can possess the characteristics of pure black color.

In an embodiment, at least one of the first light absorption layer 151 or the second light absorption layer 153 may comprise a P-type dopant such as F4-TCNQ.

In an embodiment, the first electrode layer 120 is, for example, an anode, and the second electrode layer 130 is, for example, a cathode, and the first electrode layer 120 can be realized by a reflective electrode layer.

In an embodiment, the OLED display 100 further comprises a light emitting layer 160 formed on the substrate 110 and covering the pixel defining layer 140 and the first electrode layer 120, wherein the second electrode layer 130 is located on the substrate 110 and covers the light emitting layer 160. That is, the light emitting layer 160 is located between the first electrode layer 120 and the second electrode layer 130.

As indicated in FIG. 1, the light absorption composite layer 150 is formed between the substrate 110 and each of the first electrode layer 120 and the pixel defining layer 140. That is, the light absorption composite layer 150 corresponds to a plurality of pixel regions P and the pixel defining layer 140. In an embodiment, the light absorption composite layer 150 of the OLED display 100 is a film layer formed under the first electrode layer 120. Since the light absorption composite layer 150 is formed at the bottom, the light absorption composite layer 150 can thus absorb the light emitted by the light emitting layer 160 and radiated towards the bottom via the pixel defining layer 140 to avoid the light being reflected to adjacent pixels from the bottom of the display and causing side light-leakage. Also, when the pixel defining layer 140 is viewed from outside the display panel, the pixel defining layer 140 will show a black color which not only reduces the influence of the light reflected from the first electrode layer 120 and increases the contrast when the display is used in an outdoor environment, but also makes the display more readable to the viewer.

Since the light absorption composite layer 150 is a full-plane layer and does not have any patterns corresponding to the pixel regions P, the high-precision mask etching process is not required, and the problems derived from poor precision in alignment can thus be avoided.

Figure 2:
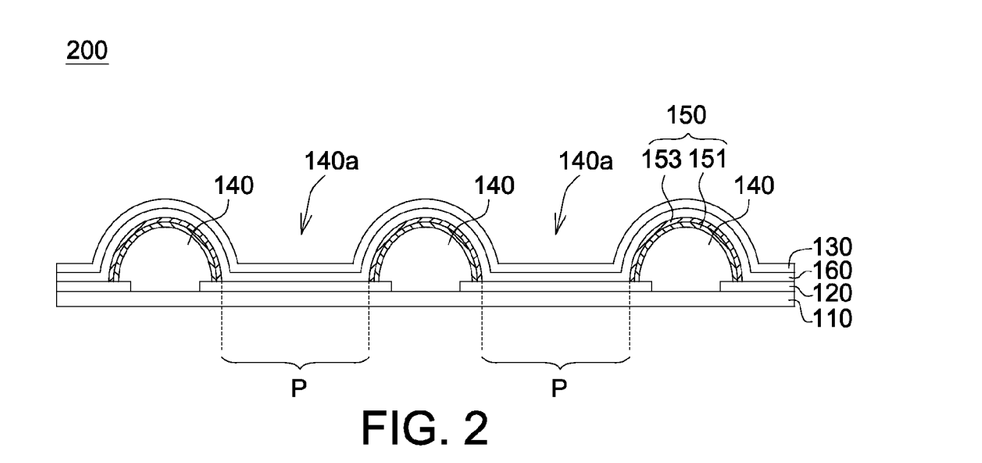
FIG. 2 is a schematic diagram of an OLED display according to another embodiment of the disclosure.

FIG. 2 a schematic diagram of an OLED display 200 according to another embodiment of the disclosure. For elements common to the present embodiment and above embodiments, the same numeric designations are retained, and the descriptions of elements which were already disclosed in above embodiments are not repeated here.

As indicated in FIG. 2, the light absorption composite layer 150 is located on the pixel defining layer 140. To put it in greater details, the light absorption composite layer 150 is only formed on the pixel defining layer 140, and the pixel regions P are exposed outside the light absorption composite layer 150. In the present embodiment, the light absorption composite layer 150 is formed between the light emitting layer 160 and the pixel defining layer 140. That is, the light absorption composite layer 150 of the OLED display 200 has fault openings 140a corresponding to the patterns of the pixel regions P, and can effectively isolate light leakage between the pixel regions P.

In another embodiment, the light absorption composite layer 150 of the OLED display further may comprise a third light absorption layer (not illustrated). The third light absorption layer is formed on the second light absorption layer 153 and absorbs a light with a wavelength different from that of the light absorbed by the first light absorption layer 151 and that of the light absorbed by the second light absorption layer 153.

Figure 3:
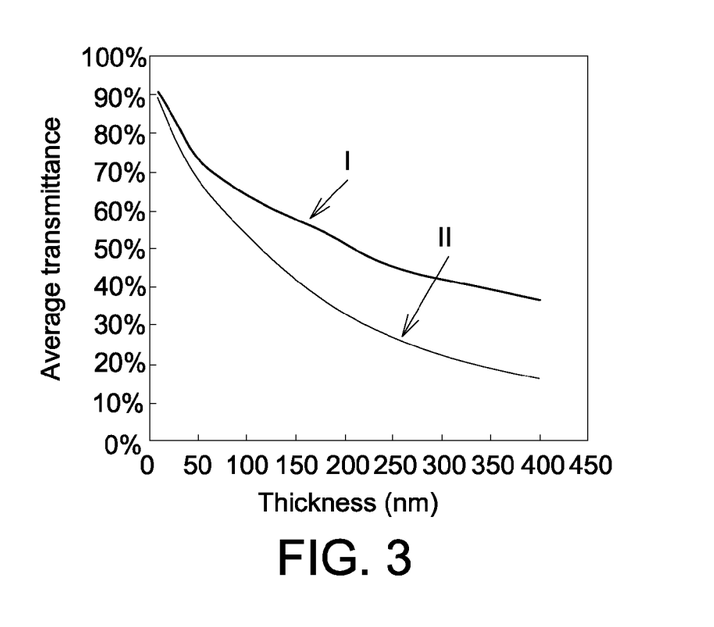
FIG. 3 is a relationship diagram of thickness vs average transmittance for the first light absorption layer and the second light absorption layer according to an embodiment of the disclosure.
Figure 4:
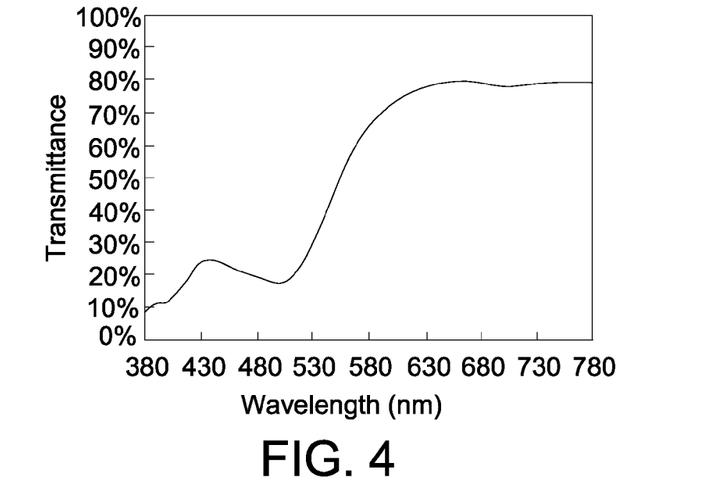
FIG. 4 is a relationship diagram of light-emitting wavelength vs transmittance of the first light absorption layer according to an embodiment of the disclosure.
Figure 5:
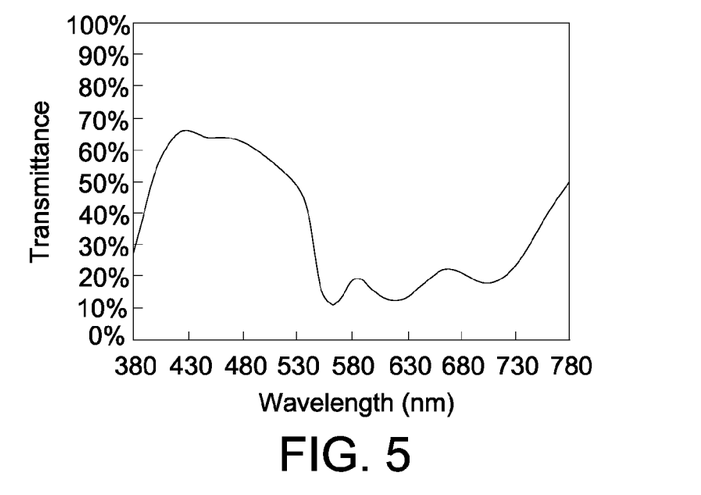
FIG. 5 is a relationship diagram of light-emitting wavelength vs transmittance of the second light absorption layer according to an embodiment of the disclosure.
Figure 6:
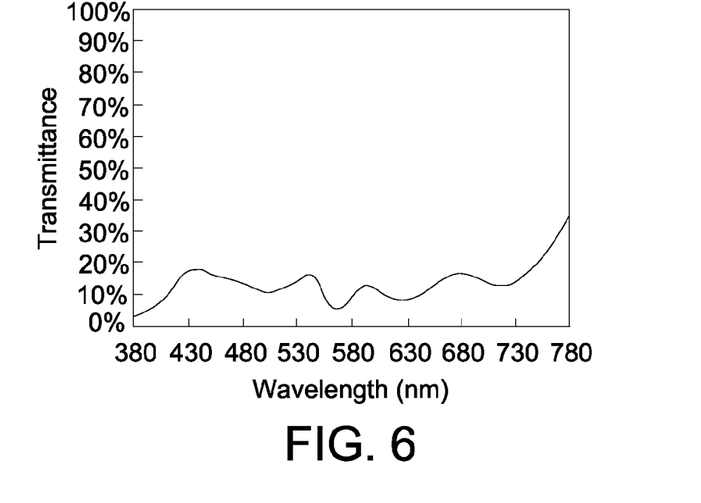
FIG. 6 is a relationship diagram of light-emitting wavelength vs transmittance of the light absorption composite layer according to an embodiment of the disclosure.
Figure 7:
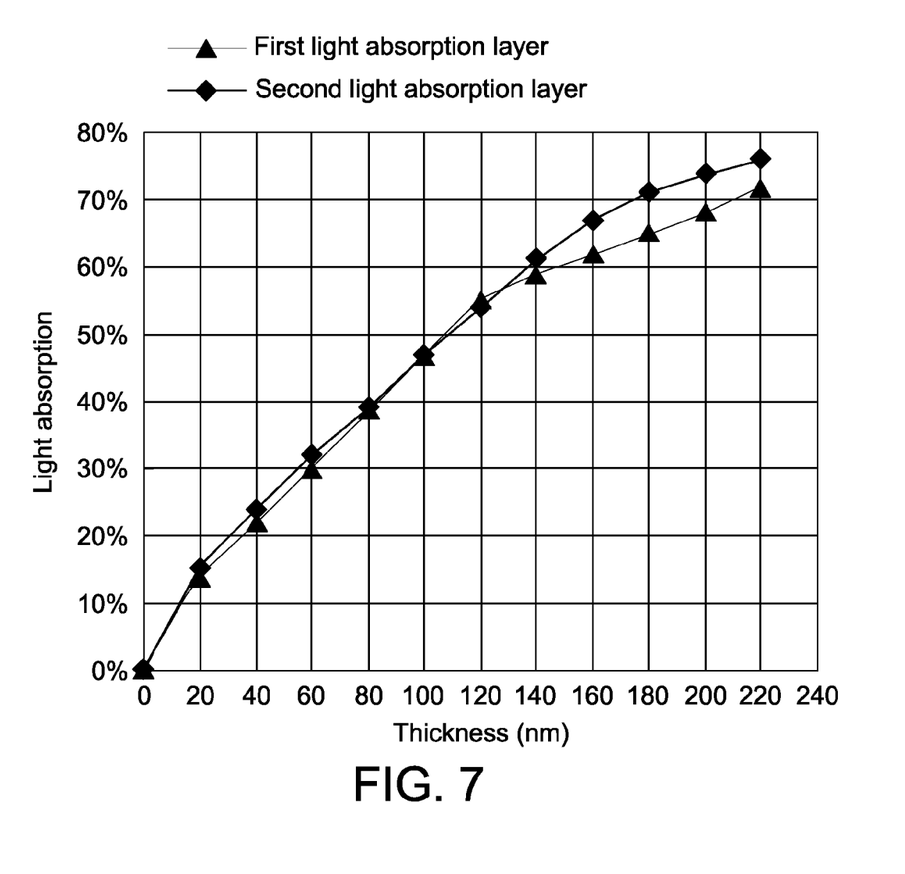
FIG. 7 is a relationship diagram of thickness vs light absorption for the first light absorption layer and the second light absorption layer according to an embodiment of the disclosure.

A number of embodiments are disclosed below for explanatory purpose. In the following embodiments, the first light absorption layer 151 comprises a P-type dopant, and the second light absorption layer 153 comprises CuPc. FIG. 3 is a relationship diagram of thickness vs average transmittance for the first light absorption layer 151 and the second light absorption layer 153 according to an embodiment of the disclosure. FIG. 4 is a relationship diagram of light-emitting wavelength vs transmittance of the first light absorption layer 151 according to an embodiment of the disclosure. FIG. 5 is a relationship diagram of light-emitting wavelength vs transmittance of the second light absorption layer 153 according to an embodiment of the disclosure. FIG. 6 is a relationship diagram of light-emitting wavelength vs transmittance of the light absorption composite layer 150 according to an embodiment of the disclosure. FIG. 7 is a relationship diagram of thickness vs light absorption for the first light absorption layer 151 and the second light absorption layer 153 according to an embodiment of the disclosure. However, the following embodiments are for exemplary and explanatory purpose only, not for limiting the scope of protection of the disclosure. It should be noted that transmittance and light absorption are complimentary to each other. When the first light absorption layer 151 and/or the second light absorption layer 153 has high transmittance with respect to a light, the first light absorption layer 151 and/or the second light absorption layer 153 will have low light absorption with respect to the light.

FIG. 3 illustrates average transmittance for wavelength of 550~750 nm. As indicated in FIG. 3, the average transmittance is inversely proportional to the thickness of the film layer, wherein curve I represents the relationship of thickness vs average transmittance for the first light absorption layer 151 formed of P-type dopant, curve II represents the relationship of thickness vs average transmittance for the second light absorption layer 153 formed of CuPc. After the first light absorption layer 151 and the second light absorption layer 153 are stacked together to form the light absorption composite layer 150, the overall average transmittance will be even lower due to the additive effect.

As indicated in FIG. 4, the first light absorption layer 151 formed of a P-type dopant has excellent absorption in the region of 380~500 nm with a transmittance of at most 20%. As indicated in FIG. 5, the second light absorption layer 153 formed of CuPc has excellent absorption in the region of 550~730 nm with a transmittance of at most 20%. Therefore, the light absorbed by the first light absorption layer 151 formed of a P-type dopant and the light absorbed by second light absorption layer 153 formed of CuPc are in different regions of wavelength. As indicated in FIG. 4 and FIG. 5, the first wavelength and the second wavelength are respectively defined as 380~500 nm and 500~780 nm for the first light absorption layer 151 formed of P-type dopant, and are respectively defined as 400~550 nm and 550~730 for the second light absorption layer 153 formed of CuPc. The first wavelength of the first light absorption layer 151 (380~500 nm) is different from the second wavelength of the second light absorption layer 153 (550~730 nm). The transmittance corresponding to the first wavelength of the first light absorption layer 151 (380~500 nm) is smaller than the transmittance corresponding to the second wavelength (500~780 nm), but the transmittance corresponding to the first wavelength of the second light absorption layer 153 (400~550 nm) is greater than the transmittance corresponding to the second wavelength (550~730 nm). As indicated in FIG. 6, after the first light absorption layer 151 and the second light absorption layer 153 are stacked to form the light absorption composite layer 150, the transmittance of the light absorption composite layer 150 is lower than 20% in the region of 380~730 nm. This implies that the light absorption composite layer 150 effectively absorbs visible light and is capable of isolating light leakage between the pixel regions.

As indicated in FIG. 7, when the first light absorption layer 151 formed of a P-type dopant and the second light absorption layer 153 formed of CuPc both have a thickness greater than 110 nm, the two light absorption layers 151 and 153 can both have a light absorption greater than 50%.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An organic light emitting diode (OLED) display having a plurality of pixel regions and comprising:
    a substrate;
    a pixel defining layer separating the pixel regions; and
    a light absorption composite layer located on the substrate, wherein the light absorption composite layer is formed between the substrate and the pixel defining layer, and the light absorption composite layer comprises:
        a first light absorption layer for absorbing a light with a first wavelength; and
        a second light absorption layer located on the first light absorption layer for absorbing a light with a second wavelength, wherein the second wavelength is different from the first wavelength, and the second light absorption layer is stacked on and directly contacts the first light absorption layer.

2. The OLED display according to claim 1, wherein the first light absorption layer has a transmittance of 20~80% of the light with the first wavelength, and the second light absorption layer has a transmittance of 20~80% of the light with the second wavelength.

3. The OLED display according to claim 1, wherein the first light absorption layer further absorbs the light with the second wavelength, and a transmittance of the first light absorption layer of the light with the first wavelength is smaller than a transmittance of the first light absorption layer of the light with the second wavelength.

4. The OLED display according to claim 3, wherein the second light absorption layer further absorbs the light with the first wavelength, and a transmittance of the second light absorption layer of the light with the first wavelength is greater than a transmittance of the second light absorption layer of the light with the second wavelength.

5. The OLED display according to claim 1, wherein the first light absorption layer has a thickness of 500~4000 Å, and the second light absorption layer has a thickness of 500~4000 Å.

6. The OLED display according to claim 1, wherein at least one of the first light absorption layer or the second light absorption layer comprises an organic material.

7. The OLED display according to claim 1, further comprising:
    a first electrode layer located on the substrate and corresponding to the pixel regions;
    a light emitting layer located on the substrate and covering the pixel defining layer and the first electrode layer; and
    a second electrode layer located on the substrate and covering the light emitting layer.

8. An organic light emitting diode (OLED) display having a plurality of pixel regions and comprising:
    a substrate;
    a pixel defining layer separating the pixel regions;
    a light absorption composite layer located on the substrate, wherein the light absorption composite layer comprises:
        a first light absorption layer for absorbing a light with a first wavelength; and
        a second light absorption layer located on the first light absorption layer for absorbing a light with a second wavelength, wherein the second wavelength is different from the first wavelength, and the second light absorption layer is stacked on and directly contacting the first light absorption layer;
    a first electrode layer located on the substrate and corresponding to the pixel regions;
    a light emitting layer located on the substrate and covering the pixel defining layer and the first electrode layer; and
    a second electrode layer located on the substrate and covering the light emitting layer, wherein the light absorption composite layer is formed between the light emitting layer and the pixel defining layer.

9. The OLED display according to claim 8, wherein the first light absorption layer has a transmittance of 20~80% of the light with the first wavelength, and the second light absorption layer has a transmittance of 20~80% of the light with the second wavelength.

10. The OLED display according to claim 8, wherein the first light absorption layer further absorbs the light with the second wavelength, and a transmittance of the first light absorption layer of the light with the first wavelength is smaller than a transmittance of the first light absorption layer of the light with the second wavelength.

11. The OLED display according to claim 10, wherein the second light absorption layer further absorbs the light with the first wavelength, and a transmittance of the second light absorption layer of the light with the first wavelength is greater than a transmittance of the second light absorption layer of the light with the second wavelength.

12. The OLED display according to claim 8, wherein the first light absorption layer has a thickness of 500~4000 Å, and the second light absorption layer has a thickness of 500~4000 Å.

13. The OLED display according to claim 8, wherein at least one of the first light absorption layer or the second light absorption layer comprises an organic material.

* * * * *